United States Patent [19]

LeVasseur et al.

[11] Patent Number: 4,963,414

[45] Date of Patent: Oct. 16, 1990

[54] LOW THERMAL EXPANSION, HEAT SINKING SUBSTRATE FOR ELECTRONIC SURFACE MOUNT APPLICATIONS

[75] Inventors: Robert D. LeVasseur, Binghamton; Stephen A. McKeown, Endicott, both of N.Y.

[73] Assignee: General Electric Company, Binghamton, N.Y.

[21] Appl. No.: 364,409

[22] Filed: Jun. 12, 1989

[51] Int. Cl.$^5$ ............................................... B32B 3/00
[52] U.S. Cl. ................................. 428/195; 428/285; 428/408; 428/457; 428/461; 428/901; 174/250; 361/397
[58] Field of Search ............... 428/195, 285, 408, 457, 428/461, 901; 174/68.5; 361/397

[56] References Cited

U.S. PATENT DOCUMENTS

| | | | |
|---|---|---|---|
| 4,318,954 | 3/1982 | Jensen | 428/209 |
| 4,591,659 | 5/1986 | Leibowitz | 428/408 |
| 4,609,586 | 9/1986 | Jensen et al. | 428/209 |
| 4,689,110 | 8/1987 | Leibowitz | 361/414 |
| 4,711,804 | 12/1987 | Burgess | 428/209 |
| 4,812,792 | 3/1989 | Leibowitz | 361/387 |
| 4,837,664 | 6/1989 | Rodriquez, II et al. | 361/386 |
| 4,849,858 | 7/1989 | Grapes et al. | 361/388 |

Primary Examiner—Patrick Ryan
Attorney, Agent, or Firm—Richard V. Lang; Fred Jacob; Ernest F. Chapman

[57] ABSTRACT

The heat sinking substrate herein disclosed is comprised of a core consisting of a rigid graphitic solid in which hexagonal graphite crystallites are bond together by coal tar pitch, the core being enclosed by two metallic face sheets having a coefficient of thermal expansion suited to the electronic packages it supports. The substrate is designed to be installed into a module with a printed wiring board on either side, the module being installed in parallel with other like modules into a chassis. The heat generated by the electronics is input over the face of the substrate and withdrawn by cooling in the walls of the chassis with which the substrates are in good thermal contact. The grain of the core is aligned for maximum thermal conduction along the path to the chassis walls. The substrate is of low weight, has a CTE matched to the supported electronic packages, high thermal conductance, and uses low cost materials.

19 Claims, 2 Drawing Sheets

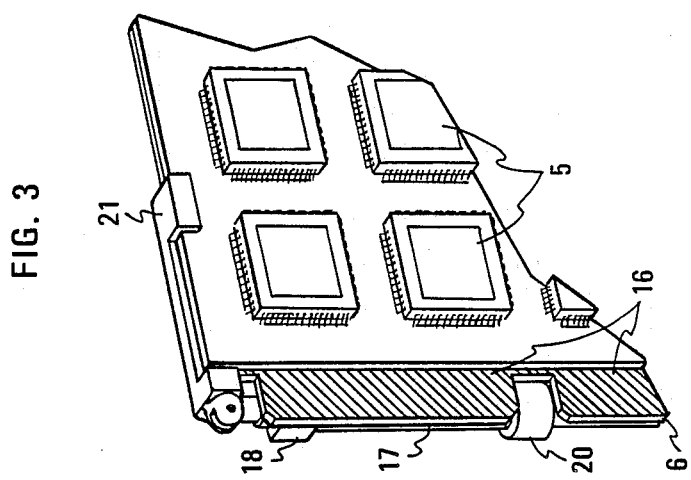
FIG. 3
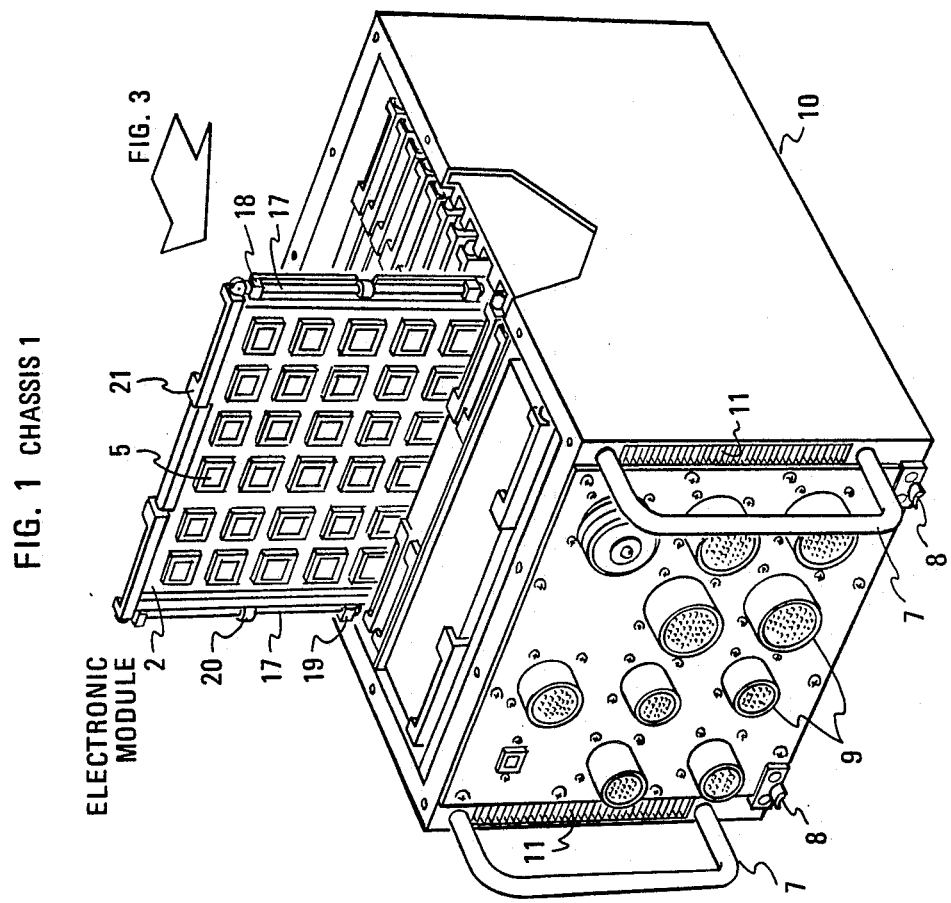
FIG. 1 CHASSIS 1

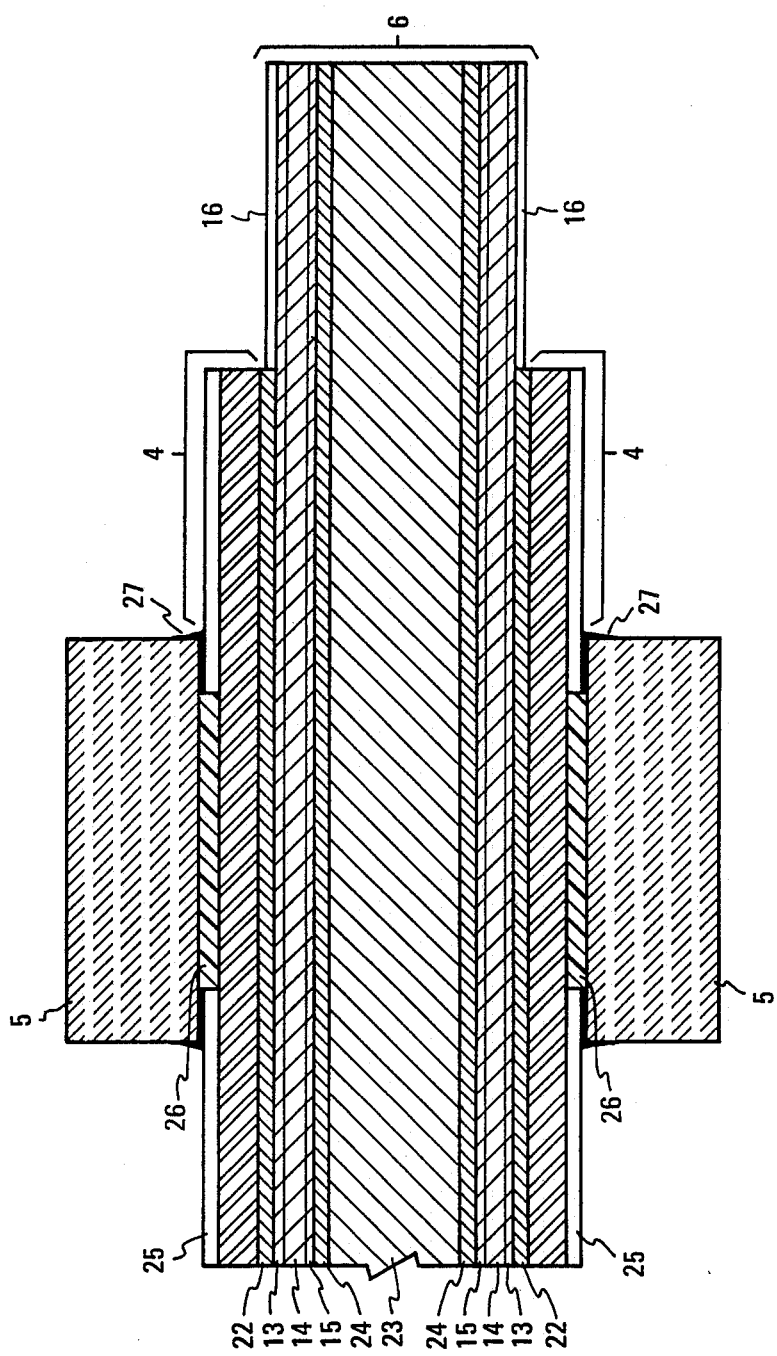

LOW THERMAL EXPANSION, HEAT SINKING SUBSTRATE FOR ELECTRONIC SURFACE MOUNT APPLICATIONS

The present invention relates to an improved substrate for supporting printed wiring boards and associated integrated circuit devices in high power density and high population density configurations.

BACKGROUND OF THE INVENTION

The current trend is to pack more and more electronic circuitry into smaller and smaller spaces. With greater population or packing densities comes higher power densities and the consequent generation of more heat. In addition, many applications subject electronic circuitry to harsh environments of elevated and widely varying temperatures. Thermal management of integrated circuit packaging is thus of paramount importance both to limit semiconductor device junction temperature rise and to avoid mismatches in the thermal expansions of the packaging elements. Excessive junction temperatures imperil semiconductor device reliability and service life. Thermal coefficient of expansion mismatches can cause delamination and cracking in the substrates and printed wiring boards, as well as solder joint failures. The latter consequence is particularly acute in the case of surface mounted, leadless ceramic chip carriers which are now being widely used due to their more efficient space utilization. Thus, successful thermal management involves heat sinking the electronic circuitry to efficiently remove heat and selecting packaging materials of properly matched thermal coefficients of expansion. Unfortunately, the most efficient heat sink materials are high thermal conductivity metals, such as copper and aluminum, which have thermal coefficients of expansions several times greater than that of a typical ceramic chip carrier.

One approach to thermal management of electronic circuitry packaging has been to use low coefficient of thermal expansion (CTE) metals, such as Invar, Kovar, and molybdenum. Typically, these low CTE metals are clad with copper face sheets and incorporated as one or more core layers in packaging substrates. While these low CTE metals can provide effective CTE control, their heat transfer characteristics are not as good as copper and aluminum and they carry a significant weight penalty.

To accommodate both effective CTE control and heat sinking, commonly assigned, Burgess U.S. Pat. No. 4,711,804 discloses a circuit board construction comprising a high thermal conductivity core of aluminum or copper which is apertured at the ceramic chip carrier sites to accept low CTE metal inserts of, for example, Invar.

Another approach to thermal management of integrated circuit packaging is to utilize fiber reinforced resins in substrate cores for CTE control. Because of its extremely low CTE, Dupont's Kevlar aramid is being highly touted as a fiber material. Jensen U.S. Pat. No. 4,318,954 discloses using a graphite filament reinforced epoxy resin in a printed wiring board substrate. Jensen et al U.S. Pat. No. 4,609,586 discloses a printed wiring board laminate comprised of a graphite fiber reinforced matrix of a metal such as aluminum, copper or magnesium for CTE control and heat dissipation.

In certain applications, such as defense electronics and avionics, integrated circuit packaging technology is faced with other extraordinary and varied challenges. Size and weight become crucial considerations. Low CTE metals present weight penalties which may not be acceptable in certain avionics applications. Mechanical strength and stiffness are equally important considerations. Thus, composite material substrates of multiple layers have been used to achieve increased strength and rigidity while avoiding excessive weight. As can be expected, composite substrate structures using specialty materials are expensive from the standpoints of fabrication, processing and materials costs.

It is accordingly an object of the present invention to provide an improved integrated circuit packaging substrate.

An additional object is to provide an integrated circuit packaging substrate of the above character, whose temperature coefficient of expansion is well matched to that of ceramic chip carriers A further object is to provide an integrated circuit packaging substrate of the above character, which has a high thermal conductivity such as to efficiently convey heat energy away from semiconductor devices supported thereon Another object is to provide an integrated circuit packaging substrate of the above character, which possesses superior mechanical strength.

An additional object is to provide an integrated circuit packaging substrate of the above character, which is capable of safely and reliably supporting densely populated printed wiring boards in hostile environments.

Yet another object is to provide an integrated packaging substrate of the above character, which is capable of meeting stringent weight and space requirements.

A still further object is to provide an integrated packaging substrate of the above character, which is convenient and inexpensive to manufacture and reliable over a long service life Other objects of the invention will in part be obvious and in part appear hereinafter

SUMMARY OF THE INVENTION

In accordance with the present invention, there is provided an improved heat sinking substrate for surface mounted electronic device packages capable of affording effective thermal management in the packaging of semiconductor devices and interconnecting circuitry. The substrate has a core consisting of a rigid graphitic solid in which hexagonal graphitic crystallites are bonded together by pitch to which face sheets of a low coefficient of thermal expansion (CTE) metal, such as copper-clad molybdenum are laminated. These face sheets in combination with the graphitic core, provide high flexural stiffness to the substrate. The CTE of the substrate, which may be tailored to application by adjusting of the copper to molybdenum ratio, may be selected to provide a CTE in the range of 5-7 ppm/° C., which closely matches the CTE of leadless, surface mountable ceramic chip carriers. Solder joint failure from thermally induced mechanical stresses under extreme temperature cycling environmental conditions is avoided by this construction.

Since both the core and face sheet materials are highly thermally conductive, the substrate constitutes an effective heat sink to efficiently extract thermal energy from the heat dissipating devices in the electronic package. The graphitic core being of light weight in relation to its thermal conductance and strength permits the resulting substrate to meet stringent space and weight requirements. The substrate of the present invention can be economically fabricated from readily available low cost materials, and thus constitutes an inexpensive thermal management approach to the packaging of densely populated integrated circuitry.

DESCRIPTION OF THE DRAWINGS

For a full understanding of the nature and objects of the present invention, reference may be had to the following detailed description taken in connection with the accompanying drawings, in which:

FIG. 1 is an illustration in perspective of a chassis for air borne applications containing a plurality of heat producing electronic modules, one of which is shown in a partially extracted position, each module comprising a novel heat sinking substrate serving to support two printed wiring boards, the substrate upon being cooled by air circulating in the walls of the chassis, removing heat produced in the associated printed wiring boards;

FIG. 2 is a cross-sectional illustration of a portion of an electronic module, the figure particularly illustrating the measures by which the heat sinking substrate removes heat from the associated printed wiring boards; and FIG. 3 is an illustration in perspective of a corner of an electronic module particularly illustrating the measures for removing heat from the heat sinking substrate by intimate contact with the cooled walls of the chassis.

DETAILED DESCRIPTION OF THE INVENTION

FIG. 1 is an illustration in perspective of an electronic chassis 1 in which electronic modules 2, each containing a novel heat sinking substrate 6 (as shown in FIGS. 2 and 3), are installed. The illustrated chassis is for an airborne application and contains cooling means designed to carry away heat generated by the electronic modules. Each module comprises a pair of printed wiring boards 4 (as shown in FIG. 2) bearing a plurality of surface mounted electronic device packages 5, each pair of printed wiring boards being supported upon a single heat sinking substrate 6. The chassis 1 is shown in FIG. 1 with the cover removed to illustrate the contained electronic modules, and shows one electronic module 2, partially removed from the chassis.

The chassis, as is conventional in airborne electronics, is itself a removable package, having handles 7 to the right and left which permit the chassis to be removed from a rack (not shown). The fasteners for holding the chassis in place in the rack are partially shown at 8. In the illustrated embodiment, the electrical connections to the chassis are provided by circular connectors 9 spaced over the front of the chassis. Forced air cooling is provided by ports (not shown) in the rack, which connect at the back of the chassis to ducts running from back to front within the side walls of the chassis. The cooling air, on passing through ducts in the side walls absorbs heat from the electronic modules, which are in good thermal contact with the side walls 10 and then exits via the front ports 11, having removed heat from the chassis.

The construction of the module is perhaps best illustrated in FIG. 2. The centrally placed heat sinking substrate 6, consisting of the core 23, pairs of conductive face sheets 13, 14, 15 and an internal bonding layer 24 are illustrated assembled. The printed wiring boards 4 are shown bonded by a second bonding layer 22 to the heat sinking substrate 6. The printed wiring board 4 has a conductor run 25 on the top surface, to which the leadless surface mounted electronic device package 5 makes electrical connection. The attachment of the package 5 to the printed wiring board is by soldering (illustrated at 27), the region immediately between the printed wiring board and the device 5 being partially filled with solder resist 26.

Heat flows from the package 5 into the substrate 6 along the following path to the cooling side walls of the chassis. The solder connections and physical paths (i.e. resist) between the package 5 and printed wiring board 4 provide the means for transferring heat generated in the package from the package to the printed wiring board. The path continues through the printed wiring board to the heat sinking substrate 6. Once the heat enters the heat sinking substrate, the core and face sheets conduct the heat to the nickel plated end surfaces 16 of the heat sink, which are cooled by being inserted into slots in the sidewalls of the chassis.

The heat sink 6 thus collects the heat produced in the individual electronic packages 5, which each module has in large numbers and which enters the flat surfaces of the substrate through the small thickness dimensions of the various intervening layers, and conveys that heat over the larger transverse dimensions in the plane of the substrate to the side walls 10 of the electronic chassis where cooling is provided.

The heat sinking substrate of the module is optimized to perform the foregoing heat transfer function. The core 23 of the substrate is a graphitic solid having good transverse thermal conducting properties, and the two face sheets 13, 14, 15 are of copper-molybdenum-copper which also have good thermal conducting properties. The nickel plating of the perimeter of the copper sheet 13, at the sides of the substrate where thermal contact is made with the cooling walls of the chassis, further insures a low thermal impedance path with the cooling side walls.

Thermal continuity through the bonds to the copper layers 13, 15 is insured by care in the formation of the bonds 22 and 24. The internal bond 24 between the core 23 and the copper sheet 15 is an aramid reinforced epoxy resin to be more fully described hereinafter. The exposed copper surface of the sheets 15 are etched in the region of attachment to form a black or brown oxide to facilitate a good bond to 24.

Similarly the sheets 13 are etched to facilitate a good bond to the printed wiring board 4. The printed wiring board, typically of a Kevlar epoxy has a coefficient of thermal expansion (CTE) of about 7 or 8 ppm/° C. Depending upon the exactness of the match of the CTE of the printed wiring board to the substrate, a hard or a soft adhesive may be used to bond the printed wiring board 4 to the oxided copper layer 13 of the substrate. "Thermabond" available from Arlon Silicone Technology Division is a compliant thermally conductive adhesive suitable for use with a Kevlar epoxy printed wiring board having a CTE of 7 to 8 ppm/° C. The rubber like material is available in sheets which are in a B stage requiring curing to form the final bond.

The provisions for insuring good thermal contact to the nickel plated regions 16 of the substrate with the slotted walls 10 are best illustrated in FIGS. 1 and 3.

The modules are provided with a camming mechanism (17–21) designed to press one nickel plated surface 16 at each side of the heat sink into engagement with the side of a slot formed for each of the modules in the side wall 10 of the chassis. The camming mechanism consists of a rotating shaft 17 supported by upper and lower pivots 18 and 19 attached to the substrate at one of the nickel plated surfaces. The shaft 17 rotates to tighten a cam 20. The camming mechanism is designed to fit within the slot in the chassis side wall and to fit tightly or loosely depending upon the position of the cam. The shaft is rotated by the operating lever 21 which is shown in a folded down position. The camming mechanism is not itself the subject of the present invention, and is disclosed in the U.S. Pat. No. 4,157,593 of Basmajian and Kurtz, the contents of which are hereby incorporated by reference.

When the operating lever 21 is raised to a vertical position, it is free to rotate. Rotation of the lever causes rotation of the shaft 17 and with it the cam 20. When the cam 20 is in the module insertion or removal position, the cam is withdrawn toward the substrate and the engagement of the module with the slot is loosened. When the cam is tightened, the cam 20 presses against one wall of the slot, and that pressure forces the nickel plated surface 16 of the substrate into engagement with the other wall of the slot. The engagement with cam tightening is positive, and provides a good thermal contact between the substrate and the cooled walls of the chassis.

The substrate materials, as noted earlier, include a rigid, graphitic core 23 and a face sheet 13, 14, 15 of copper-molybdenum-copper attached to each of the opposed planar core surfaces, by means of a Kevlar-/epoxy prepreg bonding layer. The nature of the core and face sheets may be further described.

The graphitic core 23 is of a rigid, low density, low thermal coefficient of expansion material commonly known as "industrial grade graphite".

Industrial grade graphite, in thicknesses suitable for use in a substrate, has a tensile strength of approximately 8000 kN/m$^2$ (1/32nd that of aluminum), a flexural strength of 18,000 kN/m$^2$, a compressive strength of 31,000 kN/m$^2$ (comparable to Douglas fir wood) and has a Young's modulus of 13.5 GN/m$^2$ (1/5th that of aluminum). Industrial grade graphite has a low apparent density of approximately 1.7 g/cc, with a porosity of 22%. The material has a low coefficient of thermal expansion of 0.6 ppm/° C. (approximately one seventh that of silicon which is 4.2 ppm/° C. and a high thermal conductivity of 216 W/m/° C. in the direction of heat flow (substantially equal to pure aluminum).

Industrial grade graphite has the additional desirable physical properties of being an inert, refractory material and is of low cost. A major use is as a crucible for use in a furnace in which metals are reduced to a molten state. The material retains its rigidity to temperatures as high as 2700° C., but gradually oxidizes in oxidizing atmospheres at temperatures above 500° C. Due to its extensive industrial use, and the prevalence of the low cost raw material, industrial grade graphite is available in large quantities at low cost.

A suitable graphitic core for the application herein treated is available from Morganite Inc. of Dunn, N.C. under the designation "Grade CS graphite". The material is also referred to as "carbon plates".

The graphitic core material used herein consists of a synthetic graphite to which a pitch binder is added to create a rigid low density solid. The synthetic graphite is formed from petroleum coke, the solid residue which remains from refining petroleum by a cracking process.

Graphite is an allotropic form of carbon. The allotropic form is a hexagonal crystalline system in which the carbon occurs in small platelets, which collectively form sheetlike layers or "foliated" masses. Graphite is soft and greasy to the touch and is used as a lubricant. The graphite lubricant, which may be formed from petroleum coke is essentially pure carbon, retaining substantially no other hydrocarbon residue from the original petroleum coke.

Industrial graphite of the type used herein is formed by sintering a combination of synthetic graphite derived from petroleum coke with pitch derived from coal tar. Soft coal contains a 70–80 percent of fixed carbon and 30–20 percent of volatile matter. When soft coal is heated in a closed retort, the volatile matter is driven off as a gas and as coal tar. The coal tar produces a succession of materials as the coal tar is subjected to successive stages of destructive distillation. Pitch is the residue at 350° C. which represents about 55% of the coal tar (with earlier lower temperature residues representing 45% of the coal tar and the final retort carbon residue at 1200° C. representing 17% of the coal tar).

In preparing industrial graphite by sintering, a proprietary temperature in excess of 350° C. but less than 500° C. is reached in which the hydrocarbon residues from the coal tar pitch are partly volatilized but a portion remains as a binder for the graphite, which is the principal constituent. The resulting mass is porous (22%) and the hexagonal platelets or crystallites are fixed in the binder in orientations more randomly distributed than in a monolithic crystalline solid. The material has a typical grain size of 0.75 mm, and the finished material may be manufactured to possess a grain orientation in which the thermal conductivity has a preferred direction. (The thermal conductivity with the grain is 216 W/m/° C. while that across the grain is only 123 W/m/° C. in one available material.) The porous quality of the graphite may be attributed to the voids created as the material is sintered and the pitch binder is further volatilized. The internal adhesion between the platelets in the final material is due to the binding effect of the higher temperature hydrocarbon residues. The core material may be characterized as a rigid graphitic solid in which hexagonal graphite crystallites are bound together by pitch.

The "grain orientation" of the graphitic core for maximum heat conductivity for use in the present embodiments should lie in the plane of the core and should be directed between the ends of the substrates bearing the heat exchanging surfaces 16.

The form of graphite employed in the present core material may be distinguished from "fibrous" graphite. In fibrous graphite, the hexagonal platelets are interconnected by carbon to carbon molecular bonds. In "fibrous" graphite, the fibers possess high tensile strengths while remaining individually flexible. Fibrous graphite may be used to form rigid solids by their inclusion as reinforcing fibers into a rigid mass such as an epoxy. The cost of fibrous graphite is many times more than industrial grade graphite, and the resultant products are comparably more expensive.

The adhesive 24 bonds the graphitic core to the face sheets in the following manner. The graphitic core is prepared for bonding to the face sheets by abrading, washing, and drying. The face sheets are treated in the regions where a bond to the core is to be formed with a conventional oxidant which forms a black or brown copper oxide. The oxide is formed on the inner copper layers 15 in the same manner as the outer copper layers 13 are treated for bonding to the printed wiring board 4.

A suitable adhesive, which bonds well to both the oxided copper and the prepared graphitic core is a laminate such as an aramid fiber reinforced epoxy mentioned earlier. One such laminate is available from Arlon Electronic Substrates Division of California under the product number HI-4093 Epoxy/Kevlar Chip Carrier Laminates. The raw laminate (without the copper layers) exhibits a CTE of approximately 6 ppm/° C. and has a glass transition temperature of 125° C. The laminate is available in sheet sizes of 0.075 mm and thicker and includes an aramid reinforcing sheet preimpregnated with an epoxy. The 0.075 mm laminate thickness is suitable for use in the present application. Dupont Kevlar 49 aramid is a suitable material for the reinforcement. The CTE of the aramid/epoxy laminate is a close match to the CTE of the face sheets, and forms a satisfactory bond thereto.

The face sheets are comprised of a roll-bonded laminate of copper-clad molybdenum (CCM) (i.e. copper-molybdenum-copper). A suitable CCM laminate, comprised of 13% (by volume) OFHC copper—74% pure molybdenum—3% OFHC copper is available from AMAX Specialty Metals Corporation having a CTE of approximately 6.0 ppm/° C. Another suitable laminate is 20% OFHC copper—60% molybdenum—20% OFHC Copper which has a CTE of approximately 7.0 ppm/° C.

Copper-clad molybdenum has the advantages of superior thermal conductivity and mechanical strength over other low CTE metals for use for the face sheets 13, 14, 15. The proportioning of the volume percentage between the copper 13, 15 and the molybdenum 14 allows one to control the CTE of the face sheets of the substrate. The CTE of pure molybdenum is approximately 5 ppm/° C. while that of OFHC copper is slightly below 16 ppm/° C. One can accordingly adjust the CTE from about 5 to about 11 ppm/° C., with the range of 5 to 7 ppm/° C. being of greatest practical interest. The measured CTE falls slightly (0.7 ppm/° C.) as the total thickness of the face sheet increases from 0.25 mm to 0.75 mm. The CCM laminate face sheets constitute 15 to 40 percent of the substrate volume. In the present embodiment, the face sheets are used in 0.25 mm thicknesses, and the core is typically 2.5 mm.

The relative thickness of the graphitic core and that of the face sheets are varied to provide the requisite thermal management and physical strength for a particular application. A substrate 6 with two face sheets (13, 14, 15) on the order of 0.25 mm thick and a graphitic core 23 on the order of 2.5 mm thick will yield a CTE of 6.0 ppm/° C., a thermal conductivity of 175 W/m/° C., and a flexural modulus of 96 GPa and is suited to modules of up to 650 square cms.

The embodiment described is satisfactory for surface mounted solder bonded ceramic packaged electrical components up to about 16.5 mm on a side, which have a normal CTE (for alumina) of about 6 ppm/° C. Larger component sizes are normally leaded devices in which flexibility is present in the leads and a CTE match is not so critical.

From the foregoing description, it is appreciated that the novel heat sinking substrate 6 may be effectively matched in respect to the CTE of ceramic electronic device packages. In this respect the copper-clad molybdenum has a distinct advantage over pure aluminum which has a CTE of 23-24 ppm/° C., or boron-/aluminum which has a CTE of 11-12 ppm/° C.

Moreover, the novel substrate 6 is an extremely effective heat sink. The thermal conductivity of copper-clad molybdenum is 189 W/m/° C., while graphite is even better at 216 W/m/° C. in a path from the heat sources along the length of the substrate to the exchanging surfaces 16 and 123 W/m/° C. through the thickness of the substrate. The quality of heat conduction of the heat sinking substrate is thus substantially equal to that of pure aluminum.

Thermal energy is thus efficiently transferred from the integrated circuit chips encapsulated in ceramic carriers 16 into the heat sinking substrate, and then to the heat exchanging surfaces in the walls of the chassis. With appropriate design, an efficient low cost means is disclosed to limit junction temperature rise to safe values in a populated, high power density applications.

In addition to affording effective CTE control and superior heat transfer characteristics, the use of graphite as a substrate core material affords significant weight savings. The density of industrial grade graphite is only 1.72 g/cc, as compared to 9.83 g/cc for copper-clad molybdenum, and the graphite core constitutes the major portion of the substrate volume. This represents a significant reduction in substrate weight which is highly beneficial, particularly in avionics applications. Yet the intimately bonded face sheets give the substrate, the requisite mechanical strength to withstand vibration and physical shock encountered in hostile environments. Yet another advantage of substrate 6 is its ease of fabrication using a lamination press. The copper-clad molybdenum face sheets 13, 14, 15 of the desired dimensions, as obtained from a vendor, are treated to impart a thin black or brown oxide coating to one surface. One of the face sheets is placed in a suitable press fixture, oxide coated surface up. A sheet of 0.075 mm thick aramid/epoxy prepreg is laid over this face sheet. The graphitic core of the desired dimensions is positioned on the prepreg sheet after some core preparation, as earlier discussed. A second 0.075 mm prepreg sheet is placed over the graphitic core, followed by the other face sheet oriented oxide coating down.

The laminating press is preheated to a suitable temperature, such as 175° C. The press fixture is positioned in the laminating press with a suitable release agent. The press is activated to a suitable laminating pressure of, for example 2.2 mpa. The press is heated to gradually raise the substrate sandwich to a cure temperature of 165° C. at a rate of 18° C. per minute. This temperature is held for 40 minutes to properly cure the prepreg bond, and then the laminated substrate is allowed to cool down to 38°. Pressure is released, and the substrate is removed as a completed fabrication.

The attachment of the printed wiring boards to the substrate may occur in a similar manner, either as a part of the same process step, or as a separate later step. Typically the surface mounted ceramic electronic packages are soldered to the printed wiring boards prior to being bonded to the heat sinking substrate.

Temperature cycling, humidity and vibration tests confirm the soundness of the foregoing electronic package design. The heat sinking substrate in such tests has shown no tendency to fail and when used in electronic modules, solder joint life is prolonged.

The term "electronic device packages" has been intended to be inclusive of packages of discrete devices such as transistors, discrete circuits, and integrated circuits. The present high performance electronic device package is a ceramic having a CTE of about 6 ppm/° C. This is a good CTE match for most semiconductor materials. A good CTE match to the heat sinking substrate is readily attained by adjustment of the copper to molybdenum ratio of the substrate face sheets. There are however other packages that have higher CTE's such as "plastic" packages. The present heat sinking substrate may be designed to match packages with high CTE's by adjustment of the copper to molybdenum ratio of the substrate face sheets.

In view of the foregoing, it is seen that the objects set forth above, including those made apparent from the preceding description, are efficiently attained, and, since certain changes may be made in the construction set forth without departing from the scope of the invention, it is intended that matters of detail be taken as illustrative and not in a limiting sense.

What is claimed is:

1. A heat sinking substrate for surface mounted electronic device packages, said substrate comprising, in combination:
   A. a core consisting of a rigid graphitic solid in which hexagonal graphite crystallites are bound together by pitch, said core having opposed, planar surfaces; and
   B. a metallic face sheet adhered to each planar surface, each face sheet having a coefficient of thermal of expansion suited to said packages.

2. The heat sinking substrate set forth in claim 1 wherein
   said core is adhered to said metallic face sheets by means of a fiber reinforced resin having a coefficient of thermal expansion suited to said packages.

3. The heat sinking substrate set forth in claim 2 wherein
   said core is adhered to said metallic face sheets by means of an aramid reinforced epoxy resin.

4. The heat sinking substrate set forth in claim 2 wherein
   said metallic face sheets are formed of bonded layers of copper, molybdenum and copper respectively.

5. The heat sinking substrate set forth in claim 4 wherein
   the copper sheets of said copper, molybdenum copper face sheets are oxidized to facilitate adhesion between said face sheets and said core and adhesion to the exposed copper sheets, and
   a pair of marginal metallic layers are provided at opposite ends of the exposed copper sheets for thermal conduction to a cooler.

6. The heat sinking substrate set forth in claim 5 wherein
   said pair of marginal metallic layers are nickel.

7. The heat sinking substrate set forth in claim 5 wherein
   the crystallites of said core are oriented for maximum thermal conductivity in a plane parallel to its surfaces and extending between said marginal metallic layers for improved thermal conduction to said cooler.

8. The heat sinking substrate set forth in claim 7 wherein
   said copper to molybdenum ratio is from 15 to 40 volume percent to achieve a CTE of approximately 6 to 7 ppm/° C., and said packages are ceramic packages.

9. The heat sinking substrate set forth in claim 8 wherein
   said core is approximately 8/10 of the volume of said substrate and said face sheets are approximately 2/10 of the volume of said substrate to achieve a low weight high strength design.

10. The combination set forth in claim 4 having in addition thereto
    a printed wiring board bonded to each face sheet.

11. The combination set forth in claim 10 wherein
    said printed wiring board is of an aramid reinforced epoxy resin having a coefficient of thermal expansion suited to said packages.

12. The combination set forth in claim 10 wherein
    the copper sheets of said copper, molybdenum copper face sheets are oxidized to facilitate adhesion between said face sheets and said core and adhesion between said printed wiring board and said substrate, and a pair of marginal metallic layers are provided at opposite ends of the exposed copper sheets for thermal connection to a cooler.

13. The combination set forth in claim 12 wherein
    said pair of marginal metallic layers are nickel.

14. The combination set forth in claim 13 wherein
    the crystallites of said core are oriented for maximum thermal conductivity in a plane parallel to its surfaces and extending between said marginal metallic layers for improved thermal conduction to said cooler.

15. The combination set forth in claim 14 wherein
    said copper to molybdenum ratio is from 15 to 40 volume percent to achieve a CTE of approximately 6 to 7 ppm/° C., and said packages are ceramic packages.

16. The combination set forth in claim 15 wherein
    said core is approximately 8/10 of the volume of said substrate and said face sheets are approximately 2/10 of the volume of said substrate to achieve a low weight high strength design.

17. A heat sinking substrate for surface mounted electronic device packages, said substrate comprising, in combination:
    A. a core consisting of a rigid graphitic solid in which hexagonal graphite crystallites are bound together by coal tar pitch, said core having opposed, planar surfaces; and
    B. a metallic face sheet adhered to each planar surface, each face sheet having a coefficient of thermal of expansion suited to electronic device packages.

18. The heat sink substrate as set forth in claim 17 wherein
    said graphitic crystallites are obtained by fractionating petroleum.

19. The heat sink substrate as set forth in claim 18 wherein
    said core is formed by granular graphitic crystallites bound together by further fractionized coal tar pitch in an orientation favoring thermal conduction in a plane parallel to said core surfaces.

* * * * *